(12) United States Patent
Diewald et al.

(10) Patent No.: US 10,924,018 B2
(45) Date of Patent: *Feb. 16, 2021

(54) TRACKING ENERGY CONSUMPTION USING A BOOST-BUCK TECHNIQUE

(71) Applicant: Texas Instruments Incorporated, Dallas, TX (US)

(72) Inventors: Horst Diewald, Freising (DE); Johann Zipperer, Garching (DE); Peter Weber, Allershausen (DE); Anton Brauchle, Mering (DE)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/865,035

(22) Filed: Jan. 8, 2018

(65) Prior Publication Data
US 2018/0198370 A1    Jul. 12, 2018

Related U.S. Application Data

(63) Continuation of application No. 15/218,404, filed on Jul. 25, 2016, now Pat. No. 9,866,121, which is a
(Continued)

(51) Int. Cl.
*H02M 3/158* (2006.01)
*G01R 21/133* (2006.01)
(Continued)

(52) U.S. Cl.
CPC .......... *H02M 3/1582* (2013.01); *G01R 21/00* (2013.01); *G01R 21/133* (2013.01); *G01R 22/10* (2013.01)

(58) Field of Classification Search
CPC .. H02M 3/1582; H02M 3/1854; H02M 3/158; H02M 3/157; H02M 3/156;
(Continued)

(56) References Cited

U.S. PATENT DOCUMENTS 5,623,187 A    4/1997  Caldeira et al.
6,177,786 B1   1/2001  Shimamori
(Continued)

FOREIGN PATENT DOCUMENTS

CN    101105697 A    1/2008
CN    102089610 A    6/2011
(Continued)

OTHER PUBLICATIONS

Prosecution History of U.S. Appl. No. 13/874,608, from May 1, 2013 to Dec. 17, 2015 (224 pages).
(Continued)

*Primary Examiner* — Huy Q Phan
*Assistant Examiner* — David B Frederiksen
(74) *Attorney, Agent, or Firm* — Ebby Abraham; Charles A. Brill; Frank D. Cimino (57) ABSTRACT

The invention relates to an apparatus and method for tracking energy consumption. An energy tracking system comprises at least one switching element, at least one inductor and a control block to keep the output voltage at a preselected level. The switching elements are configured to apply the source of energy to the inductors. The control block compares the output voltage of the energy tracking system to a reference value and controls the switching of the switched elements in order to transfer energy for the primary voltage into a secondary voltage at the output of the energy tracking system. The electronic device further comprises an ON-time and OFF-time generator and an accumulator wherein the control block is coupled to receive a signal from the ON-time and OFF-time generator and generates switching signals for the at least one switching element in the form of ON-time pulses with a constant width ON-time.

5 Claims, 6 Drawing Sheets

Related U.S. Application Data continuation of application No. 14/987,527, filed on Jan. 4, 2016, now Pat. No. 9,400,296, which is a continuation of application No. 13/874,608, filed on May 1, 2013, now Pat. No. 9,231,476.

(51) Int. Cl.
*G01R 21/00* (2006.01)
*G01R 22/10* (2006.01)

(58) Field of Classification Search
CPC ........ H02M 3/155; H02M 3/145; H02M 3/10; H02M 3/04; H02M 3/02; H02M 3/00; H02M 3/33576; H02M 3/285; G01R 19/00; G01R 22/10; G01R 11/36
See application file for complete search history.

(56) References Cited

U.S. PATENT DOCUMENTS

| | | | |
|---|---|---|---|
| 6,844,739 B2 | 1/2005 | Kasai et al. | |
| 7,119,525 B1 | 10/2006 | Yoshino | |
| 7,609,051 B2 | 10/2009 | Fritz et al. | |
| 8,390,261 B2 | 3/2013 | Deboy | |
| 8,634,216 B2* | 1/2014 | Chapman | H02M 3/33523 363/71 |
| 9,231,476 B2* | 1/2016 | Diewald | G01R 21/133 |
| 9,400,296 B2* | 7/2016 | Diewald | G01R 21/133 |
| 9,618,545 B2* | 4/2017 | Diewald | G01R 21/127 |
| 9,866,121 B2* | 1/2018 | Diewald | H02M 3/1582 |
| 2003/0141857 A1* | 7/2003 | Nishida | H02M 3/156 323/282 |
| 2004/0095111 A1* | 5/2004 | Kernahan | H02M 3/157 323/282 |
| 2004/0095115 A1* | 5/2004 | Kernahan | H02M 1/0845 323/282 |
| 2004/0135560 A1* | 7/2004 | Kernahan | H02M 1/0845 323/282 |
| 2005/0111243 A1 | 5/2005 | Tzeng et al. | |
| 2005/0258812 A1* | 11/2005 | Halberstadt | H02M 3/156 323/283 |
| 2005/0275382 A1* | 12/2005 | Stessman | A61N 1/3708 320/143 |
| 2006/0145678 A1 | 7/2006 | Ribeiro et al. | |
| 2006/0149499 A1* | 7/2006 | Ribeiro | H02M 3/157 702/176 |
| 2007/0041224 A1* | 2/2007 | Moyse | H02M 3/157 363/21.01 |
| 2008/0122499 A1 | 5/2008 | Frew et al. | |
| 2008/0265849 A1* | 10/2008 | Lee | H02M 1/36 323/238 |
| 2008/0284397 A1* | 11/2008 | Chang | H02M 3/157 323/283 |
| 2009/0086511 A1* | 4/2009 | Lin | H02M 3/07 363/21.01 |
| 2009/0174262 A1* | 7/2009 | Martin | H02M 3/157 307/82 |
| 2009/0200995 A1* | 8/2009 | Tran | H02M 3/1582 323/222 |
| 2010/0207455 A1 | 8/2010 | Erickson et al. | |
| 2010/0229915 A1 | 9/2010 | Ledenev et al. | |
| 2010/0264869 A1 | 10/2010 | Dubovsky | |
| 2010/0308782 A1* | 12/2010 | Werle | H02M 3/157 323/282 |
| 2011/0031925 A1 | 2/2011 | Simburger et al. | |
| 2011/0199062 A1* | 8/2011 | Singnurkar | H02M 3/1582 323/282 |
| 2012/0126624 A1 | 5/2012 | Hester et al. | |
| 2012/0274295 A1* | 11/2012 | Lin | H02M 3/1582 323/282 |
| 2012/0293021 A1 | 11/2012 | Teggatz et al. | |
| 2013/0154372 A1 | 6/2013 | Chang et al. | |
| 2013/0249421 A1 | 9/2013 | Cavallini et al. | |
| 2013/0320946 A1* | 12/2013 | Luo | H02M 3/158 323/283 |
| 2014/0003830 A1 | 1/2014 | Higashi et al. | |
| 2014/0125304 A1* | 5/2014 | Wiethege | H02M 3/1563 323/282 |
| 2014/0300342 A1 | 10/2014 | Diewald et al. | |
| 2014/0300343 A1 | 10/2014 | Diewald et al. | |
| 2014/0301112 A1 | 10/2014 | Diewald et al. | |
| 2015/0015233 A1* | 1/2015 | Diewald | G01R 21/127 324/76.11 |

FOREIGN PATENT DOCUMENTS

| CN | 202103601 U | 1/2012 |
|---|---|---|
| CN | 102570804 A | 7/2012 |
| CN | 102751876 A | 10/2012 |

OTHER PUBLICATIONS

Prosecution History of U.S. Appl. No. 14/987,527, from Jan. 4, 2016 through Jul. 7, 2017 (549 pages).

Prosecution History of U.S. Appl. No. 15/218,404 from Jul. 25, 2016 through Dec. 21, 2017 (177 pages).

Notification of First Office Action With the National Intellectual Property Administration of P.R.C. Search Report, dated Oct. 12, 2020, 5 pages.

First Office Action for: Chinese Patent Application No. 2018113383081; Title: Tracking Energy Consumption Using a Boost-Buck Technique; dated Sep. 18, 2020, 9 pages.

* cited by examiner

TRACKING ENERGY CONSUMPTION USING A BOOST-BUCK TECHNIQUE

This application is a continuation of U.S. patent application Ser. No. 15/218,404, filed Jul. 25, 2016, which is a continuation of U.S. patent application Ser. No. 14/987,527, filed Jan. 4, 2016, now U.S. Pat. No. 9,400,296, which is a continuation of U.S. patent application Ser. No. 13/874,608, filed May 1, 2013, now U.S. Pat. No. 9,231,476, all of which are incorporated herein by reference in their entirety.

FIELD OF THE INVENTION

The invention relates to an electronic device and a method for tracking the energy consumption, and more specifically to an electronic device and a method for determining energy consumption using the principle of storing energy in an inductor and transferring the energy into output energy storing components.

The present application relates to jointly owned U.S. patent application corresponding to application Ser. No. 13/329,073 entitled, "Electronic Device and Method for Power Measurement."

BACKGROUND

Reducing energy consumption is important in the development and improvement of electronic devices, in particular if they are mobile or portable electronic devices. In order to save energy, electronic devices are more and more controlled by sophisticated schemes in which the magnitude of the consumed currents varies over several decades of magnitude. In low power modes some hundreds of nA (nano-amperes) of a current may be consumed while other operation modes require up to several hundreds of mA (milli-amperes). It is often necessary to measure these currents over a wide range (e.g. from nano-amperes to milli-amperes) with an acceptable accuracy while at the same time being able to track highly dynamic current changes. Furthermore, any side effects due to measuring the consumed energy should be avoided or well controlled. For example, it is preferred that an increase of the energy consumption due to the energy measurement itself not occur.

One of the more common techniques for measuring a current is a measurement using a shunt device or a shunt resister. Using a shunt device for the power measurement requires very high precision analogue to digital converters in order to cover the full dynamic range of the possible magnitudes of the currents. For example, when four and a half decades of measurement with one percent precision is required, a 24-Bit-converter would be required. Furthermore, shunt devices generate a voltage drop. This voltage should be compensated, while the compensation circuitry constitutes a potential source of errors. Direct load compensation can be difficult. This means that the measurement range and therefore the circuitry used for measuring the power consumption has to be adapted during the energy measurement procedure. This increases complexity and entails more potential errors.

Still further, measuring a current indirectly by measuring the voltage across a shunt device requires an initial voltage change on the target. If a buffer capacitor is coupled to the target side (output side of an energy transfer circuits), the buffer capacitor delivers current immediately and needs to be recharged. This behavior affects the true current response of the device under test. Another approach of measuring the energy consumption employs a current mirror. One side of the current mirror delivers the current to the target including the target capacitor. The other side of the current mirror is coupled to an Ampere meter to which the mirrored current is fed. This approach has the advantage that the distortion caused by the target capacitor is minimized. However, the required pairing of the power and sense field effect transistors (FET) is rather poor and is not capable of tracking the huge current magnitude to be supported.

SUMMARY

It is an object of the invention to provide an electronic device 200 and a method for measuring energy consumption in an energy consuming system that covers a large range of magnitudes of supply currents, high dynamic current changes and does not affect the basic functionality of the circuit which energy consumption is measured. According to an aspect of the invention, an electronic device 200 is provided that comprises switched mode energy tracking circuitry. The switched mode circuitry comprises one or more switching elements SWA-SWB, SW1a-SW1b and SWia-SWib, one or more in inductors, LA-Li, a capacitor CA and compare circuits 406 and 434 that control the output voltage level VO and the output voltage level V1 respectively. The switching elements, SWA-SWia, are configured to switch current through the inductors LA-Li respectively respectively. The switches, SWA-SWB, SW1a-SW1ia and SW1b-SW1ib, may be transistors. The voltage compare circuits 406 and 434 may be error amplifiers, a voltage comparators, or an A/D converters which conversion result is compared to a reference voltage VL(ref). The ON/OFF generator 408 is configured to control the ON-time and OFF-time of the switching elements, SW1a-SW1ia and SW1b-SW1ib, in order to transfer energy from a primary energy source, e.g. power supply, to the output VO of the energy tracking system and to control the level of the output voltage VO. The electronic device 200 further comprises control logic stages CNTLA, CNTL1 and CTNLi. A control block 410 comprises an error handling block 420, reporting block 416, a calibration block 428, an accumulator 430 of the individual ON-time events, a sequencing block 422, a range control block 418 and a demand control block 424.

The control logic stages CTNLA-CNTLi generate the switching signals SWSA, SWS1a to SWSib for the switched transistors, SWA-SWB, SW1a-SW1ia and SW1b-SW1ib, in the form of ON-time pulses with a constant width ON-time. The control logic stages, CTNLA-CNTLi, also control the OFF-time which is used also as an indicator of the energy in the inductors that is transferred to the output VO. The voltage-compare circuits 406 and 432 flag when the next ON-time pulse has to be generated. If the OFF-time is not over before the next ON-time is triggered, the system reports an error condition. An error condition is also reported if the output voltage VL is not within predefined limits.

The switching signals, SWS1a to SWSib, are formed according to a pulse density scheme. The highest density of pulses occurs when the On-time and OFF-time are met at the time another ON-time is requested. Higher density is enabled by default or by control information (e.g. a control bit and this is handled by the control circuit as described previously). In an embodiment of the invention, the pulse accumulator 430 can be in the simplest implementation a digital counter. The counter in this embodiment is then configured to count the number of ON-time pulses for determining the consumed power based on the number of ON-time pulses per time. The constant pulse width of the ON-time pulses makes the influence of the system components such as the non-linear behavior of switched transistors or inductors negligible. The target voltage offset at the output of the energy tracking system is highly reduced. A wide range of magnitudes of the measured current can be covered.

According to another aspect of the invention, the electronic device comprises a first capacitor C1 coupled to the input of the energy tracking system, a second capacitor CA at the input of the energy tracking blocks 204 and 206 and a third capacitor C2 coupled to the output of the energy tracking system. The ON-time of the switching element in conjunction with the inductor's L1 value and the value of the capacitor CA is configured to keep the voltage within the system accuracy requirements. The output capacitor C2 is of such value that the voltage increase during transferring the energy from the inductor L1 to Li is within the accuracy expectations.

The energy tracking system of this embodiment is contrary to a pulse width modulation scheme and nearly all energy in the inductors, L1-Li can be transferred to capacitor C2. The frequency of the ON-time pulses is proportional to and practically a linear function of the consumed current. During a settled operation condition, in which the input and output voltages and the charges on the input and output capacitors have settled, each ON-time pulse of the switched transfers about the same amount of energy.

According to another embodiment of the invention, a reference impedance 205 or a reference resistor R can be coupled to the output of the energy tracking system in order to make a reference energy measurement. The results of the reference measurement(s) can then be used for calibrating the system to the energy consumption. Therefore, the number of the ON-time pulses can be used for determining the energy consumption during normal operation even with an unknown load (e.g. C3 & Z). The unknown load according to an embodiment of the invention can be an electronic device.

In an embodiment of the invention, the electronic device 200 comprises an energy tracking system with switching components SWA-SWB, SW1$a$-SW1$ia$ and SW1$b$-SW1$ib$, inductors LA, L1, Li, transfer support diodes DA-Di. The switching components SWA-SW1$ia$ can then be configured to enable current through the inductors LA-Li respectively. The optional switches SWB-SWib may be used to conduct current during the OFF-time to support the transfer of energy from an inductor to the output. The optional switch SWB does not conduct energy after the energy transfer is completed preventing that energy from flowing back from the output to the input. The optional switches SW1$b$-SWib do not conduct energy after the energy transfer is completed preventing that energy from flowing from the output to ground. The voltage compare circuits 406 and 434 can be error comparators or error amplifiers. The voltage compare circuit 406 is configured to send a signal 426 to the control circuit 410 and the ON/OFF generator 408 so that the switching components SW1$a$-SW1$ia$ and SW1$b$-SW1$ib$ can be triggered or be prepared to be triggered. The compare circuits 406 and 434 serve to deliver the demand on energy to maintain a stable output voltage VO and V1 respectively. The generation and frequency of the ON-time pulses can be controlled in response to a change of the output voltages VO. The ON-time pulses can be combined with a time stamp on an individual basis or on a group of pulses.

Another embodiment of the invention includes ON-time pulses that are based on a defined time and the difference to that defined time base is bounded by pulses or a group of pulses. The energy consumption may then be determined based on the number of the ON-time pulses per considered time period.

In an aspect of the invention, the energy consumption may then be derived from a phase variation of the ON-time pulses. This aspect allows a quick evaluation of changes of the power consumption. The energy transfer during ON-time pulses usually is significantly smaller than the energy stored on a second capacitor CA coupled to the input of the energy transfer system. The energy withdrawn from the energy source at the input of the energy transfer system influences the energy transferred during the ON-time. The influence of the energy sourcing capability is a factor in the calibration cycle.

The energy stored on a second capacitor C2 coupled to the output of the energy transfer system is also significantly larger than the energy stored in the inductor during the ON-time and transferred to the output and the capacitor C2 during OFF-time. The energy consumption may be calibrated by coupling one or more reference impedances 205 to the output of the energy transfer system. The result of the calibration may then be used for normalizing the energy consumption during normal operation. During normal operation a target device or a device under test (DUT) 208 is then coupled to the output of the energy transfer system instead of the reference impedance 205. However, in another embodiment, the reference impedance 205 may be coupled to the output while the target load device or DUT 208 is still coupled to the output. The energy of one or a group of ON-time pulses due to the additional load of the reference load can be evaluated for calibrating the power measurement based on the energy pulse ON-time and OFF-time conditions.

BRIEF DESCRIPTION OF THE DRAWINGS

FIG. 2$a$ is a simplified circuit diagram of an embodiment of the invention.

FIGS. 2$b$ and 2$c$ are simplified circuit diagrams of an embodiment of the invention.

DETAILED DESCRIPTION OF EXAMPLE EMBODIMENTS

Figure 1:
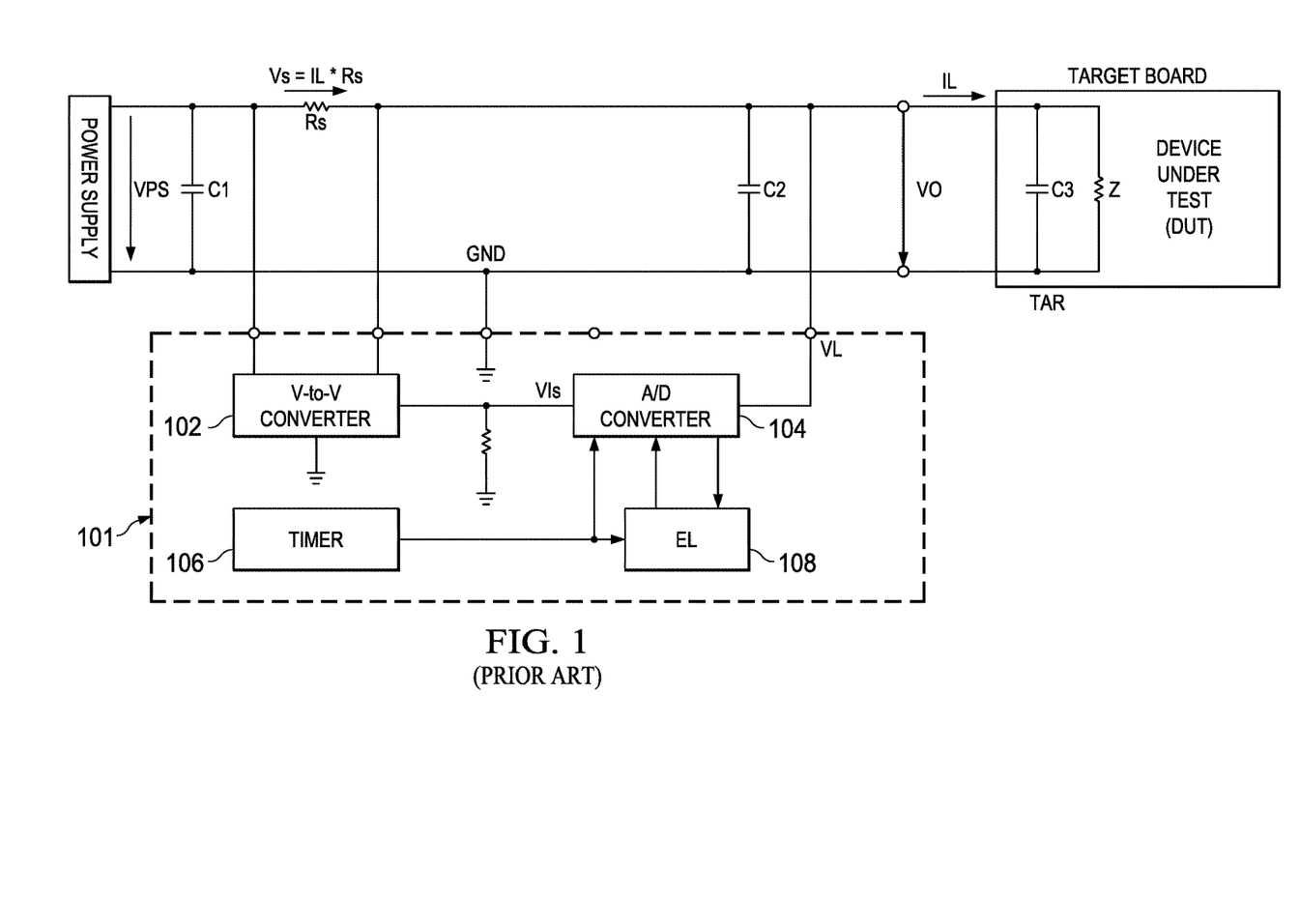
FIG. 1 shows a circuit measuring the current, the voltage and the timing relations to calculate the energy consumed within the load of the device-under-test. (Prior Art)

FIG. 1 shows a circuit 101 that measures the load current via a voltage-to-voltage converter 102, an A/D converter 104 and timer 106. The energy EL used by the load is calculated in block EL 108. The voltage VL is measured via the A/D converter 104. When the A/D converter 104 is used for sequential conversions, phase related errors may occur. A timer 106 is used to create the time base t(b) for the A/D converter 104. The energy EL used by the load (i.e. DUT) is calculated by the block EL according to equation 1 below.

$$EL_x = IL * VL * t(b) \text{ where } x = \{1 \ldots i\} \qquad \text{Equation 1}$$

Figure 2A:
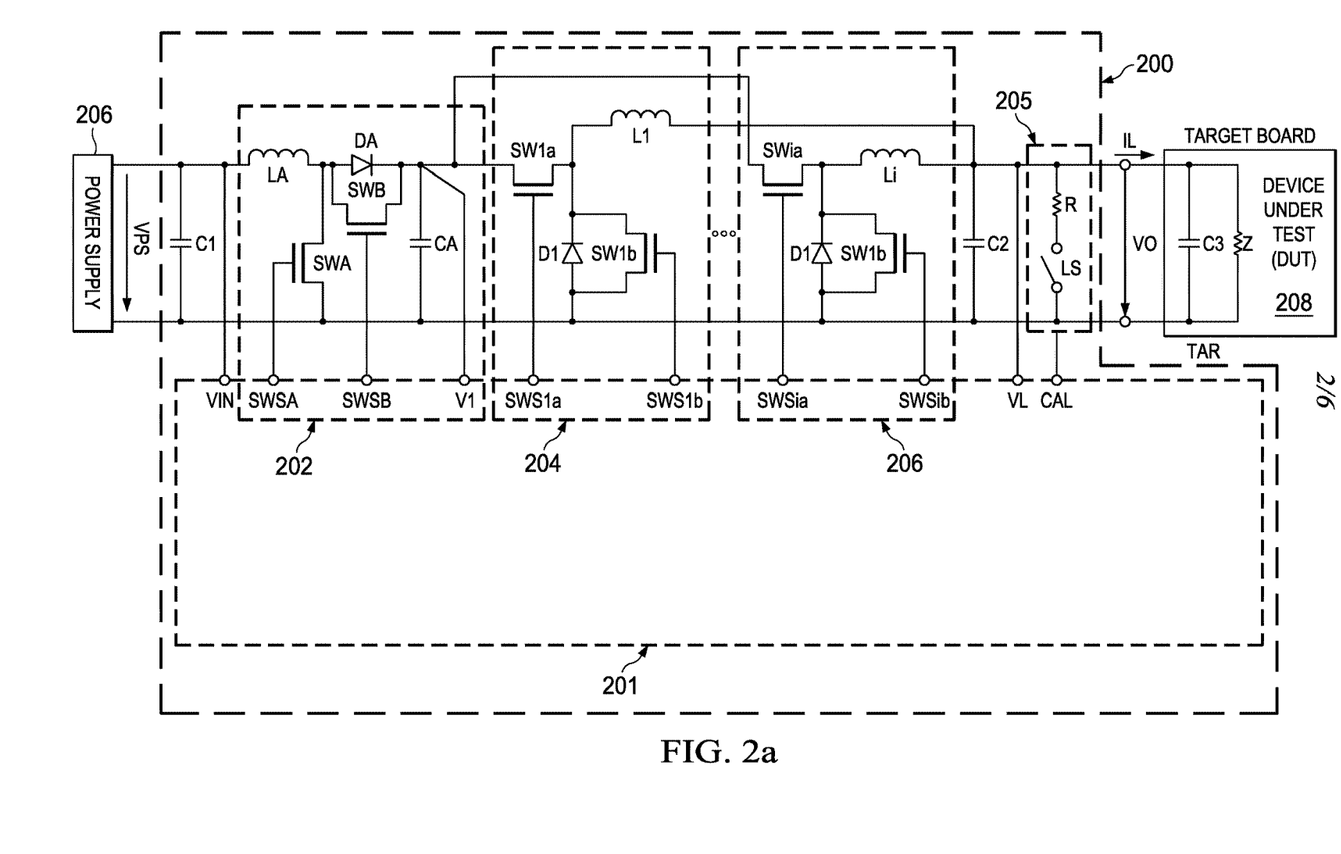

FIG. 2$a$ shows a simplified diagram of an embodiment of the invention. In this embodiment, an energy tracking system 200 comprises energy transfer blocks 202, 204, 206, a control circuit 201 and reference impedance 205. In this embodiment of the invention, energy transfer block 202 is a "boost" circuit that comprises switched transistors SWA and SWB, diode DA, capacitor CA and inductor LA. In this embodiment of the invention, energy transfer blocks 204 and 206 are "buck" circuits. Energy transfer block 204 comprises switched transistors SW1a and SW1b, diode D1, and inductor L1. Energy transfer block 206 comprises switched transistors SWia and SWib, diode Di, and inductor Li. In this example two buck energy transfer blocks 204 and 206 are shown. However, more than two buck energy transfer blocks may be used.

In boost block 202, one terminal of inductor LA is coupled to a first switched transistor SWA, a second switched transistor SWB and to the anode of diode DA. The other terminal of the inductor LA is coupled to an input of the energy transfer block 202. The cathode of the diode DA, a terminal of the capacitor CA and a terminal of the second switched transistor SWB are connected to an output of the boost block 202. A terminal of the capacitor CA and a terminal of the first switched transistor SWA are connected to ground. The switched transistors SWA and SWB can be referred to as energizing switches. The diode DA may be replaced or complemented by the second switch SWB. The control circuit 201 controls the energy switches SWSA and SWSB. A function of boost block 202 is to transfer or "boost" the voltage on the input to a higher voltage level in order to have enough voltage margin for energy tracking blocks 204 and 206. The control circuit 201 will be explained in more detail later in the specification.

In buck energy transfer block 204, one terminal of inductor L1 is coupled to a first switched transistor SW1a, a second switched transistor SW1b and to the cathode of diode D1. The other terminal of the inductor L1 is coupled to the output of the energy transfer block 204. The anode of the diode D1 and a terminal of the second switched transistor SW1b are connected to ground. A terminal of the first switched transistor SW1a is connected to the input of buck energy transfer block 204. The switched transistors SW1a and SW1b can be referred to as energizing switches. The diode D1 may be replaced or complemented by the second switch SW1b. The control circuit 201 controls the energy switches SWS1a and SWS1b. The control circuit 201 will be explained in more detail later in the specification.

In buck energy transfer block 206, one terminal of inductor Li is coupled to a first switched transistor SWia, a second switched transistor SWib and to the cathode of diode Di. The other terminal of the inductor Li is coupled to the output of the energy transfer block 206. The anode of the diode Di and a terminal of the second switched transistor SWib are connected to ground. A terminal of the first switched transistor SWia is connected to the input of buck energy transfer block 206. The switched transistors SWia and SWib can be referred to as energizing switches. The diode Di may be replaced or complemented by the second switch SWib. The control circuit 201 controls the energy switches SWSia and SWSib. The control circuit 201 will be explained in more detail later in the specification.

Figure 2B:
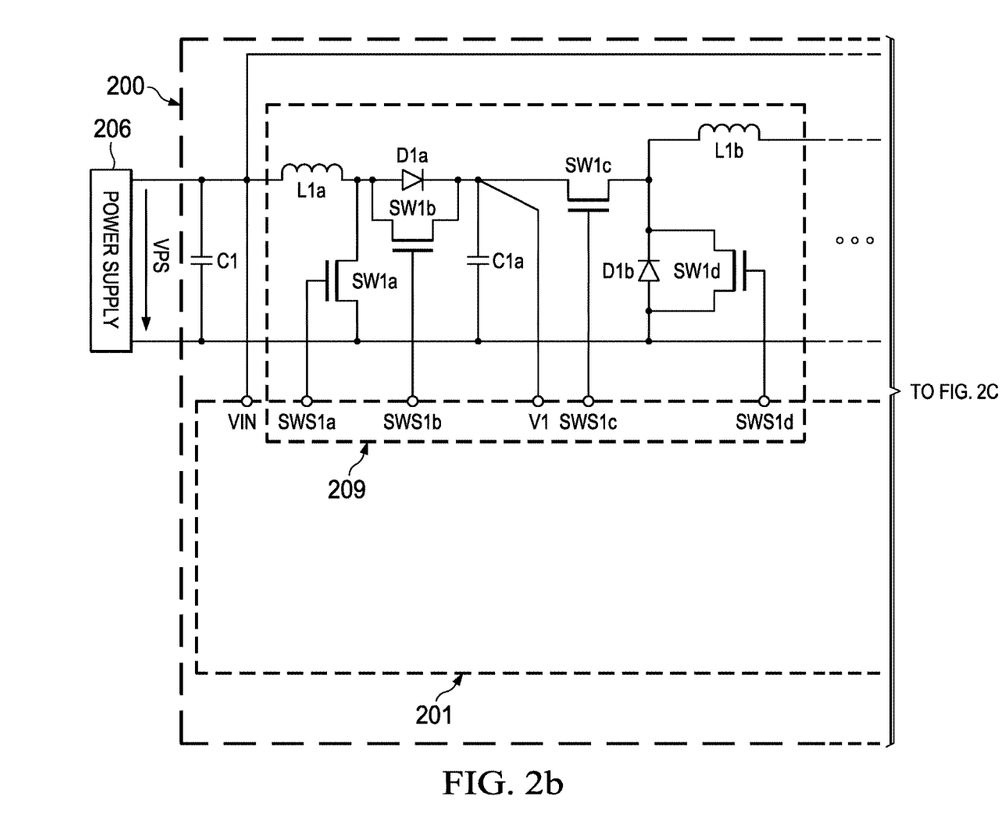

FIG. 2b shows a simplified diagram of an embodiment of the invention. In this embodiment, an energy tracking system 200 comprises energy transfer blocks 209, 211, a control circuit 201 and reference impedance 205. In this embodiment of the invention, energy transfer blocks 209 and 211 are "boost-buck" circuits. In this example two boost-buck energy transfer blocks 209 and 211 are shown. However, more than two boost-buck energy transfer blocks may be used.

In boost energy transfer block 209, one terminal of inductor L1a is coupled to a first switched transistor SW1a, a second switched transistor SW1b and to the anode of diode D1a. The other terminal of the inductor L1a is coupled to an input of the energy transfer block 209. The cathode of the diode D1a, a terminal of the capacitor C1a, a terminal of the second switched transistor SW1b and a terminal of the third switched transistor SW1c are connected together. A terminal of the capacitor C1a, a terminal of the first switched transistor SW1a, the anode of diode D1b and a terminal of the fourth switched transistor SW1d are connected to ground. A terminal of inductor L1b is coupled to a terminal of the third switched transistor SW1c, a terminal of the fourth switched transistor SW1d and to the cathode of diode D1b. The other terminal of the inductor L1b is coupled to the output of the energy transfer block 209. The switched transistors SWS1a, SWS1b, SWS1c and SWS1d can be referred to as energizing switches. The diode D1a may be replaced or complemented by the second switch SW1b. The diode D1b may be replaced or complemented by the fourth switch SW1d. The control circuit 201 controls the energy switches SWS1a, SWS1b, SWS1c and SWS1d. The control circuit 201 will be explained in more detail later in the specification.

Figure 2C:
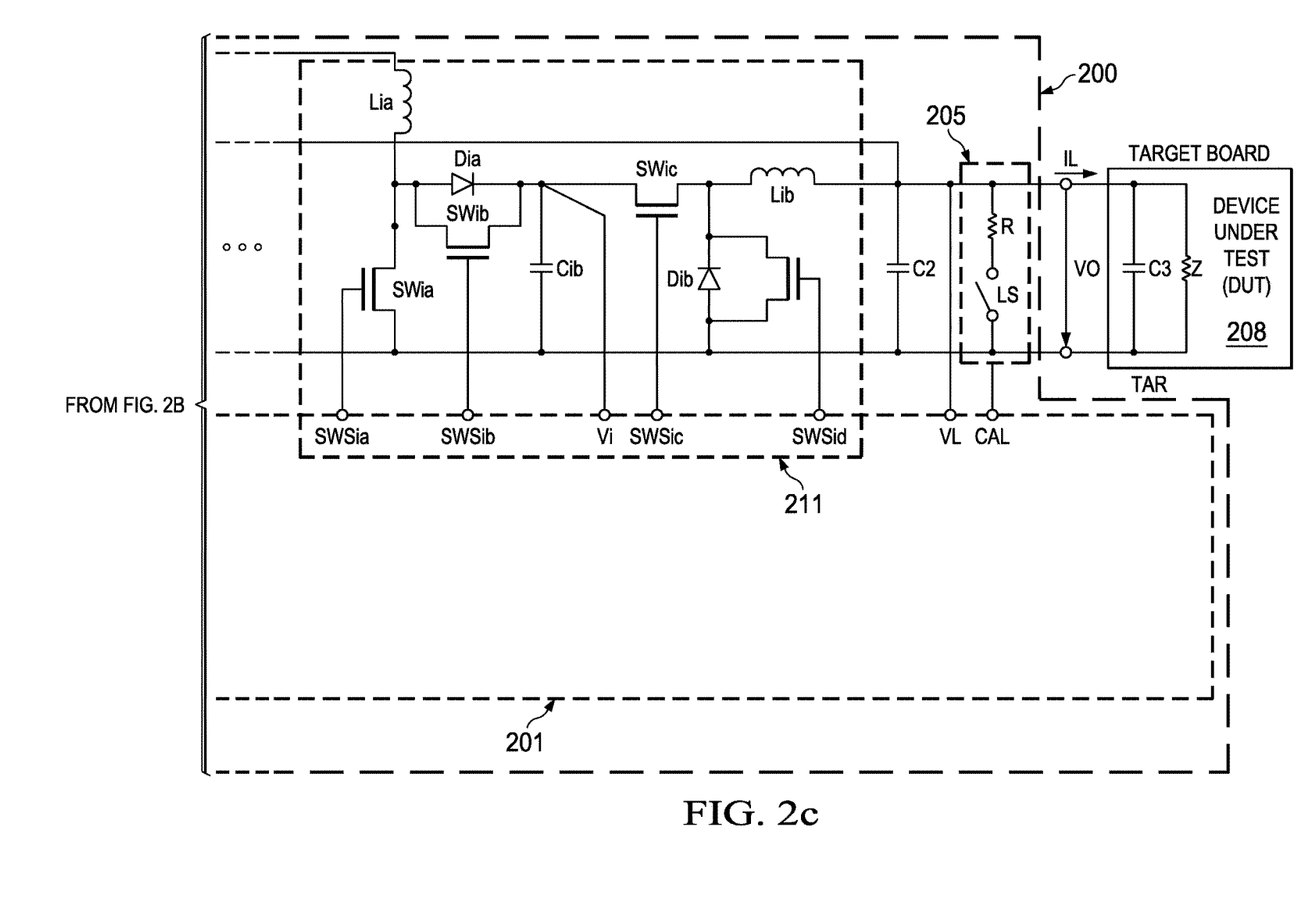

In boost energy transfer block 211, one terminal of inductor Lia is coupled to a first switched transistor SWia, a second switched transistor SWib and to the anode of diode Dia. The other terminal of the inductor Lia is coupled to an input of the energy transfer block 211. The cathode of the diode Dia, a terminal of the capacitor Cia, a terminal of the second switched transistor SWib and a terminal of the third switched transistor SWic are connected together. A terminal of the capacitor Cia, a terminal of the first switched transistor SWia, the anode of diode Dib and a terminal of the fourth switched transistor SWid are connected to ground. A terminal of inductor Lib is coupled to a terminal of the third switched transistor SWic, a terminal of the fourth switched transistor SWid and to the cathode of diode Dib. The other terminal of the inductor Lib is coupled to the output of the energy transfer block 209. The switched transistors SWSia, SWSib, SWSic and SWSid can be referred to as energizing switches. The diode Dia may be replaced or complemented by the second switch SWib. The diode Dib may be replaced or complemented by the fourth switch SWid. The control circuit 201 controls the energy switches SWSia, SWSib, SWSic and SWSid. The control circuit 201 will be explained in more detail later in the specification.

Figure 3:
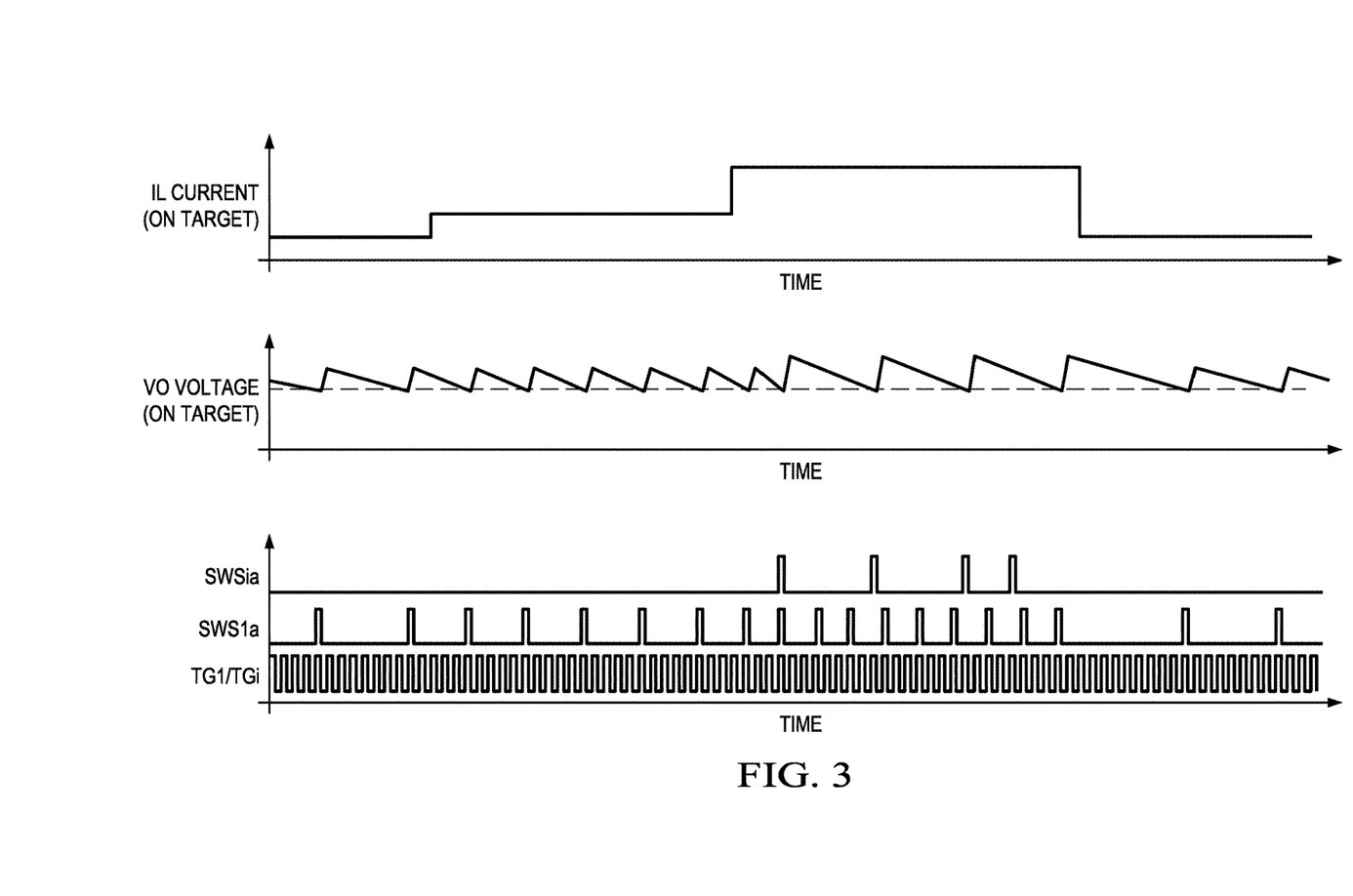
FIG. 3 is a diagram showing waveforms of signals of the circuit shown in FIG. 2$a$ according to an embodiment of the invention.

FIG. 3 shows the timing diagram for an energy transfer circuit (shown in FIG. 2a) that has two transfer paths. The first path has SW1a, L1, D1, and the ON-time signal SWS1a applied to SW1a. The switch SW1b shown in energy transfer block 204, in this example, is not used. The second path has SWia, Li, Di, and the ON-time signal SWSia applied to SWia. The switch SWSib shown in energy transfer block 206, in this example, is not used. The two energy transfer paths are used mainly to enhance the dynamic range of delivering energy. The optional switches SW1b and SWib may be used to conduct current during the OFF-time to support the transfer of energy from the inductors to the output. The optional switches SW1b and SWib do not conduct energy after the energy transfer is completed preventing that energy from flowing back from the output to the input. The system may have more than 2 paths enabling further spread of the dynamic range of the energy tracking circuits.

Figure 4:
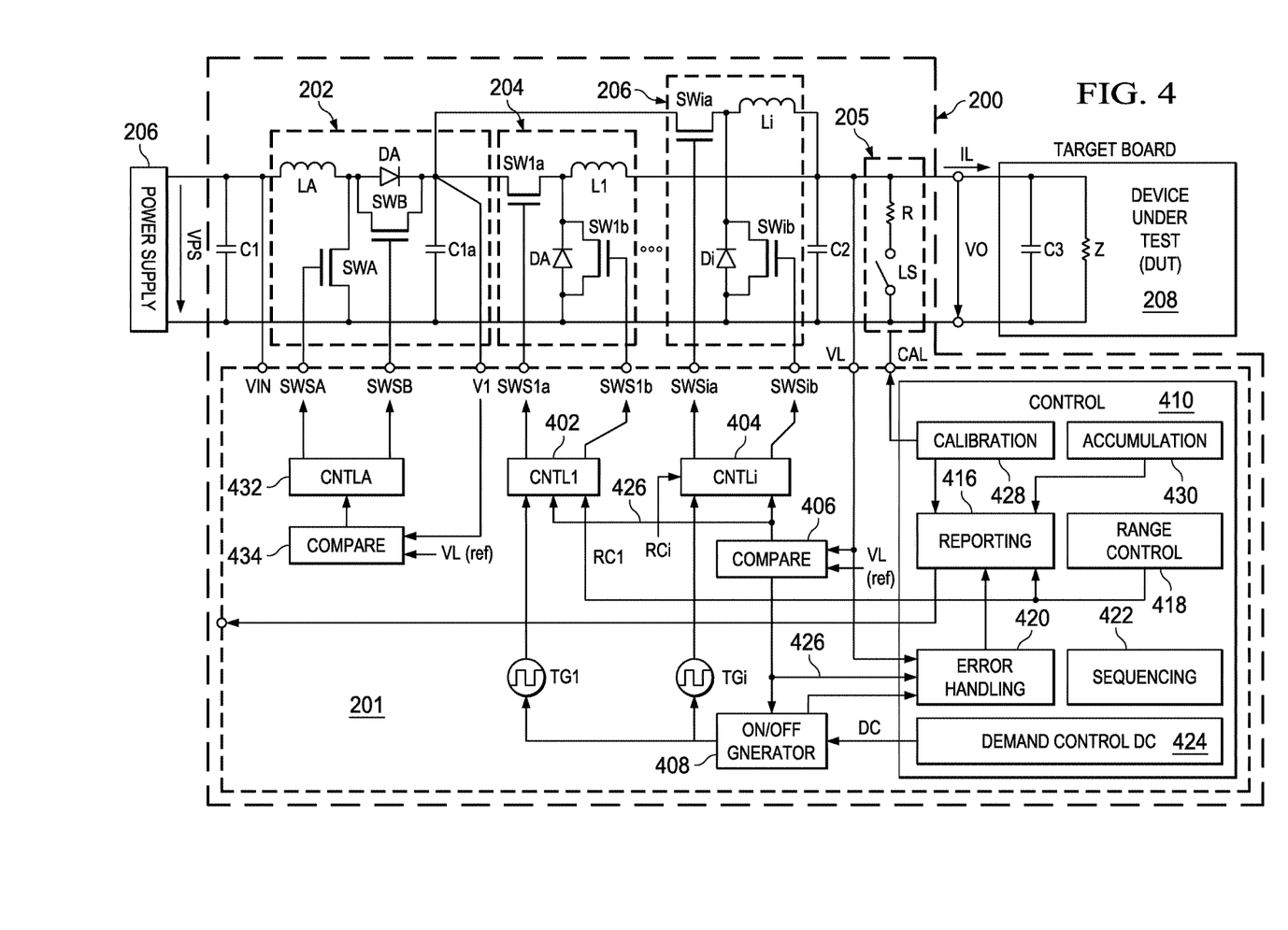
FIG. 4 is a circuit diagram of an embodiment of the invention.

FIG. 4 shows more detail in the control circuit 201. The compare circuits 406 and 434 are coupled to receive a reference signal VL(ref) that is used to determine the output voltages VL and V1. The output of the compare circuits 406 and 423 are coupled to the control logic stages CNTLA 432, CNTL1 402 and CNTLi 404. The ON-time and OFF-time generator 408 is coupled to feed the ON-time signals TG1 and TGi to the control logic CNTL1 and CNTLi respectively. The control logic stage CNTLA provides switching signals SWSA and SWSB for switching the switching element SWA and SWB to generate the voltage V1. The control logic stage CNTL1 provides switching signals SWS1a and SWS1b with constant width ON-time pulses for switching the switching element SW1a and SW1b. The control logic stage CNTLi provides switching signals SWS1ia and SWSib with constant width ON-time pulses for switching the switching element SWia and SWib.

Issuing the next ON-time pulses is a function of the output signal 426 of the compare circuit 406 and the ON/OFF-time. The constant width ON-time is generated in this embodiment from constant clock CLK (e.g. from a crystal oscillator). Such an implementation eases the calibration situation since the ON-time is nearly independent of the voltage and temperature conditions. The primary side of the energy tracking system is coupled to a first capacitor C1. Accordingly, one side of the inductor LA is coupled to one side of the first capacitor CA. The other side of the first capacitor CA is coupled to ground. The primary side of the energy tracking system is supplied by a stable supply realized by the circuit 202. The output or secondary side of the energy tracking system is coupled to a second capacitor C2 for buffering the output voltage VO. A target board or device under test 208 can be coupled to the output of the energy tracking system. The current consumed by the target board or device under test is the load current IL The level of the output voltage is VO.

One or more reference impedances 205 in the form of reference resistor R and a switch LS can be coupled through switch LS to the energy tracking system. Instead of the target board the reference resistor R can be switched to the output VO. However, the target board or DUT may still be coupled to the output during the reference measurement. The result of the reference measurement with the well characterized reference resistor R can then be used to calibrate the measurement for the operation with the unknown load (e.g. C3 & Z) of the target board 208. The energy transferred through the switched transistors SW1 and SWi during an ON-time pulse is usually much smaller than the stored on the capacitors CA and C2. If the energy that is transferred during an ON-time pulse is ESW, the energy on capacitor CA is ECA, the energy on capacitor C1 is EC1, and the energy on capacitor C2 is EC2, the following advantageous ratios are adventurous:

$$EC1 = k1 * ESWA$$

and $$ECA = k2 * (ESW1 + \ldots ESWi) \text{ where } X = \{1 \ldots i\}$$

and $$EC2 = k3 * (ESW1 + \ldots ESWi) \text{ where } X = \{1 \ldots i\}$$

with $$k1 > 20, k2 \text{ and } k3 > 50.$$

ESWA and the sum of ESW1 to ESWi are much smaller than EC1, ECA and EC2. When the output voltage VO has settled, the compare block 426 measures any deviation of target output voltage VL and versus VL(ref). The control blocks CNTL1 and CNTLi increase or decrease the density of ON-time pulses. The ON-time pulses are generated with a constant width ON-time and a minimum OFF-time. The inductors L1, and Li will be charged with a certain amount of energy from the second capacitor CA. During the OFF-time the energy in the inductors is transferred to the third capacitor C2. In an embodiment of the invention, the second capacitor CA and the third capacitor C2 are sized such that this energy transfer does not significantly change the voltages across the second capacitor CA and the third capacitor C2.

As long as the energy in the third capacitor C2 is sufficient to maintain the output voltage VO, the compare block will not request another ON-time pulse through switching signal SWS1a, SWS1b or SWSia, SWSib. However, if a certain load current IL is consumed by the target board or DUT, the voltage across the second capacitor C2 is reduced until the voltage compare block VL=VL(ref) determines that the output voltage VO at output node OUT is lower than defined and generates a request signal to CNTL1 and CNTLi. Another ON-time pulse will then be generated. During normal operation, this causes a pulse density of ON-time pulses of signals SWS1a and SWSia that is proportional to the consumed energy of the DUT/target board 208. In another embodiment, the number of ON-time pulses per time counted by the accumulator 430 and the current data there reflects and indicates the energy consumption. Under stable input voltage conditions, each ON-time pulse represents approximately the same amount of energy that is transferred during each ON-time pulse. The OFF-time variations of the ON-time pulses of the switching signal SWSi1 and SWSia also indicate current variations of the load currents IL.

A reference measurement on the known reference resistor R can be used for normalizing the measured current. The reference resistors R may be switched on through switch LS in addition to the target board 208. The influence of the reference resistor R on the OFF-time in signals SWS1a and SWSia can then be evaluated. However, the achieved result can be improved if the reference resistor R is switched on while the target board is not connected.

FIG. 3 shows a diagram with waveforms of the load current IL, the output voltage VO, and ON-time signals as applied to switches SW1a and SWS2a. The load current IL of the target or DUT increases at a certain point of time. The voltage VO at the output node OUT varies according to a saw tooth scheme around the target output voltage level. The pulse density of the ON-time pulses SWS1a and SWS2a increases at a certain point of time or starts (SWS2a) depending on the extent of the load current IL. The voltage VO varies according to a saw tooth scheme around the target output voltage level (dashed line). The pulse density of the ON-time pulses increases after the load current IL increases. This change in density of ON-time pulses of both paths is evaluated.

Although the invention has been described hereinabove with reference to a specific embodiments, it is not limited to these embodiment and no doubt further alternatives will occur to the skilled person that lie within the scope of the invention as claimed.

The invention claimed is:
1. An electronic device comprising:
a first energy transfer circuit;
a second energy transfer circuit;
a control circuit coupled to the first energy transfer circuit and the second energy transfer circuit, the control circuit comprises an ON-time and OFF-time generator, a control logic block, and an accumulator, wherein the control logic block is configured to receive a signal from the ON-time and OFF-time generator and to generate switching signals for the first energy transfer circuit and the second energy transfer circuit, and wherein the accumulator is configured to determine a consumed energy based on generated switching signals;

an inductor having a terminal;

a first switching element having a first terminal and a second terminal, the first terminal of the first switching element is coupled to the terminal of the inductor and the second terminal of the first switching element is coupled to the control circuit;

a first diode having an anode terminal and a cathode terminal, wherein the anode terminal is coupled to the terminal of the inductor;

a second switching element having a first terminal and a second terminal, the first terminal of the second switching element is coupled to the terminal of the inductor and the second terminal of the second switching element to the control circuit; and a capacitor having a first terminal, the first terminal of the capacitor is coupled to the cathode terminal of the first diode.

2. The electronic device of claim 1 wherein a second capacitor is coupled to an input of the electronic device.

3. The electronic device of claim 2 wherein a third capacitor is coupled to an output of the electronic device.

4. The electronic device of claim 1 wherein an impedance is coupled to an output of the electronic device.

5. The electronic device of claim 1 wherein the first energy transfer circuit comprises:

a third switching element, the third switching element is coupled to the control circuit and to an input of the first energy transfer circuit;

a second inductor having a first terminal and a second terminal wherein the first terminal of the second inductor is coupled to the third switching device and to an output of the first energy transfer circuit;

a second diode having a cathode terminal and an anode terminal, wherein the anode terminal is coupled to ground and the cathode terminal is coupled to the first terminal of the second inductor; and a fourth switching element, the fourth switching element is coupled to the control circuit, to the cathode of the second diode, and to the anode of the second diode.

* * * * *